United States Patent
Liu et al.

(10) Patent No.: US 9,377,813 B2
(45) Date of Patent: Jun. 28, 2016

(54) SUPPORTING STRUCTURE AND PORTABLE ELECTRONIC DEVICE EMPLOYING SAME

(71) Applicant: HON HAI PRECISION INDUSTRY CO., LTD., New Taipei (TW)

(72) Inventors: Jung-Cheng Liu, New Taipei (TW); Hsiao-Ping Chiu, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/510,850

(22) Filed: Oct. 9, 2014

(65) Prior Publication Data

US 2015/0156899 A1    Jun. 4, 2015

(51) Int. Cl.
*G06F 1/16* (2006.01)
*H05K 5/02* (2006.01)

(52) U.S. Cl.
CPC ............ *G06F 1/1626* (2013.01); *H05K 5/0204* (2013.01); *H05K 5/0234* (2013.01)

(58) Field of Classification Search
CPC ..... H05K 5/03; H05K 5/0234; H05K 5/0204; H05K 5/0226; G06F 1/1601; G06F 1/1626; G06F 1/1607; G06F 1/1613; G06F 1/166; G06F 1/1637
USPC ............ 361/679.01, 679.02, 679.21, 679.26, 361/679.27, 679.3, 679.55–679.58; 248/917–924, 688; 455/575.1–575.4
See application file for complete search history.

(56) References Cited

U.S. PATENT DOCUMENTS

| | | | |
|---|---|---|---|
| 6,282,084 B1 * | 8/2001 | Goerdt | F16M 11/16 108/115 |
| 7,920,372 B2 * | 4/2011 | Tompkin | H04M 1/0225 345/168 |
| 8,654,520 B2 * | 2/2014 | Lin | G06F 1/1624 361/679.02 |
| 2005/0001114 A1 * | 1/2005 | Ogawa | F16M 11/10 248/127 |

* cited by examiner

*Primary Examiner* — Anthony Haughton
*Assistant Examiner* — Ingrid Wright
(74) *Attorney, Agent, or Firm* — ScienBiziP, P.C.

(57) ABSTRACT

A supporting structure is for supporting a portable electronic device, the supporting structure includes a holder and a plurality of supporting portions. The holder is configured to be extendedly adjusted along a length of the holder. The supporting portions are defined in a back of the portable electronic device. The holder is configured to detachably engage with one of the supporting portions to support the portable electronic device at a predetermined supporting angle related to a placing spot of the portable electronic device. A portable electronic device employing the supporting structure is also disclosed.

18 Claims, 9 Drawing Sheets

SUPPORTING STRUCTURE AND PORTABLE ELECTRONIC DEVICE EMPLOYING SAME

FIELD

The present disclosure relates to a supporting structure, and particularly relates to a supporting structure supports a portable electronic device with multiple angles and a portable electronic device employing the supporting structure.

BACKGROUND

Portable electronic devices, such as tablet computers, need to be held by users or placed on a table for being browsed the screen. However, when the portable electronic device is held by the user for a long time, the user may become tired. When the portable electronic device is placed on the table, the portable electronic device needs support, such as some books, on its back for a right angle to be viewed hands-free. For conveniently using the portable electronic device, a holder with multiple angles of adjustment is needed.

BRIEF DESCRIPTION OF THE DRAWINGS

Many aspects of the disclosure can be better understood with reference to the following figures. The components in the figures are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
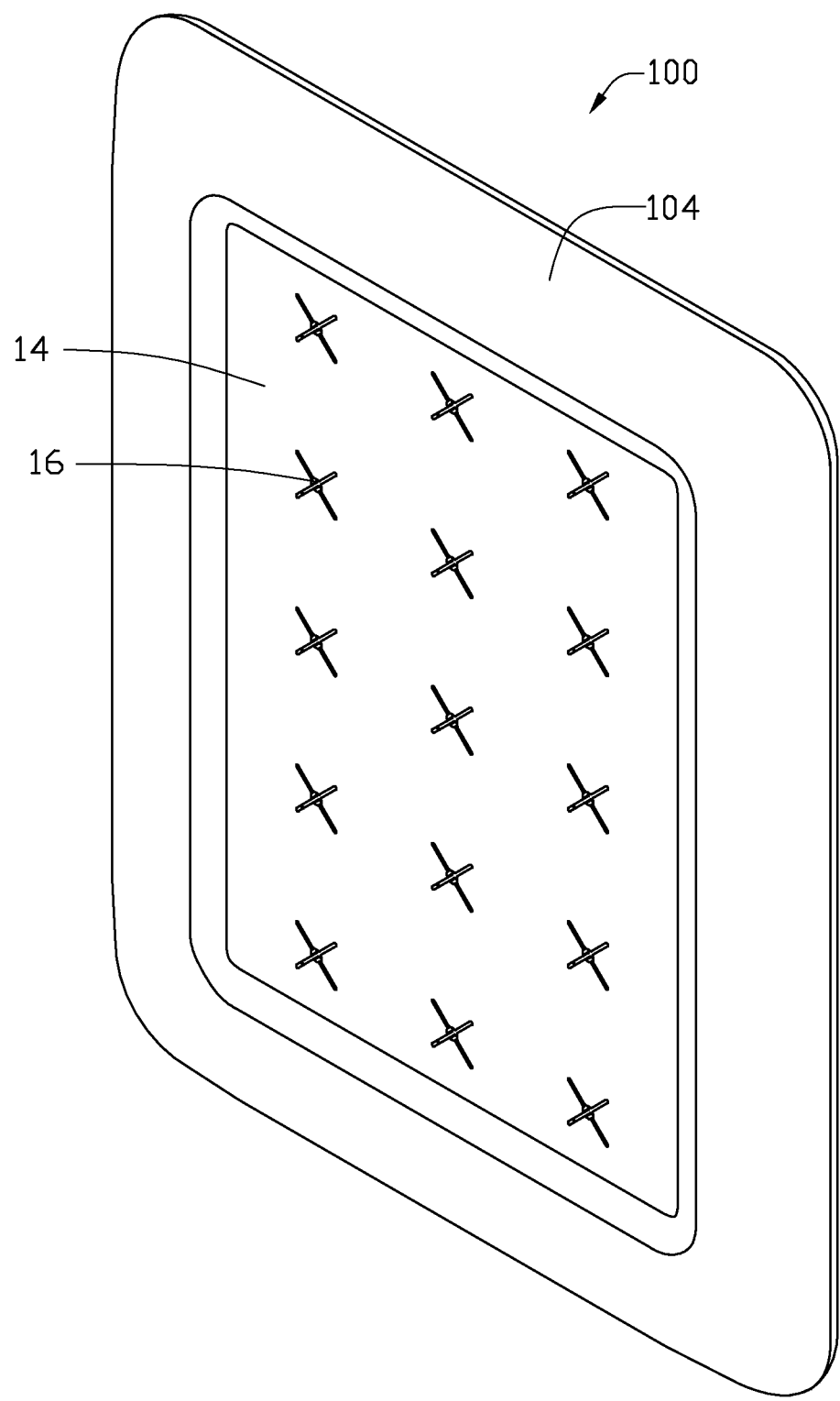
FIG. 1 is an isometric view of an exemplary embodiment of a portable electronic device.
Figure 2:
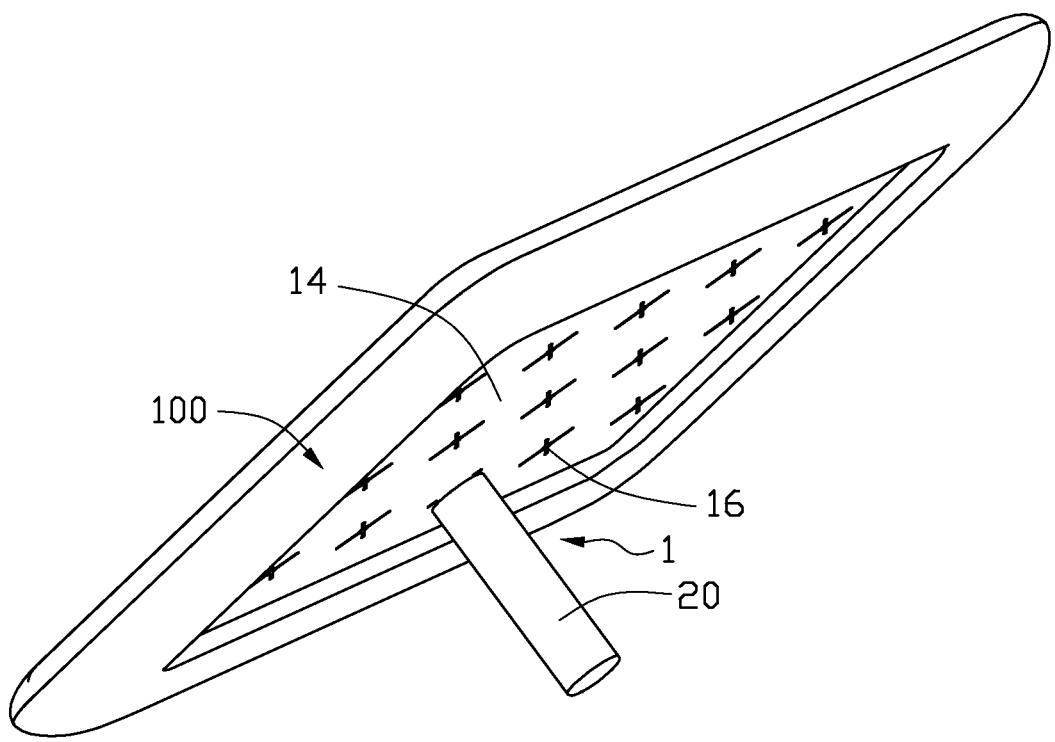
FIG. 2 is an isometric view of the portable electronic device including a supporting structure.

FIGS. 1 and 2 illustrate an exemplary embodiment of a portable electronic device 100 including a supporting structure 1. The supporting structure 1 can support the portable electronic device 100 at multiple angles. The portable electronic device 100 can be a tablet computer, a personal digital assistant, or a smart mobile phone. In one embodiment, the portable electronic device 100 is a tablet computer.

Figure 3:
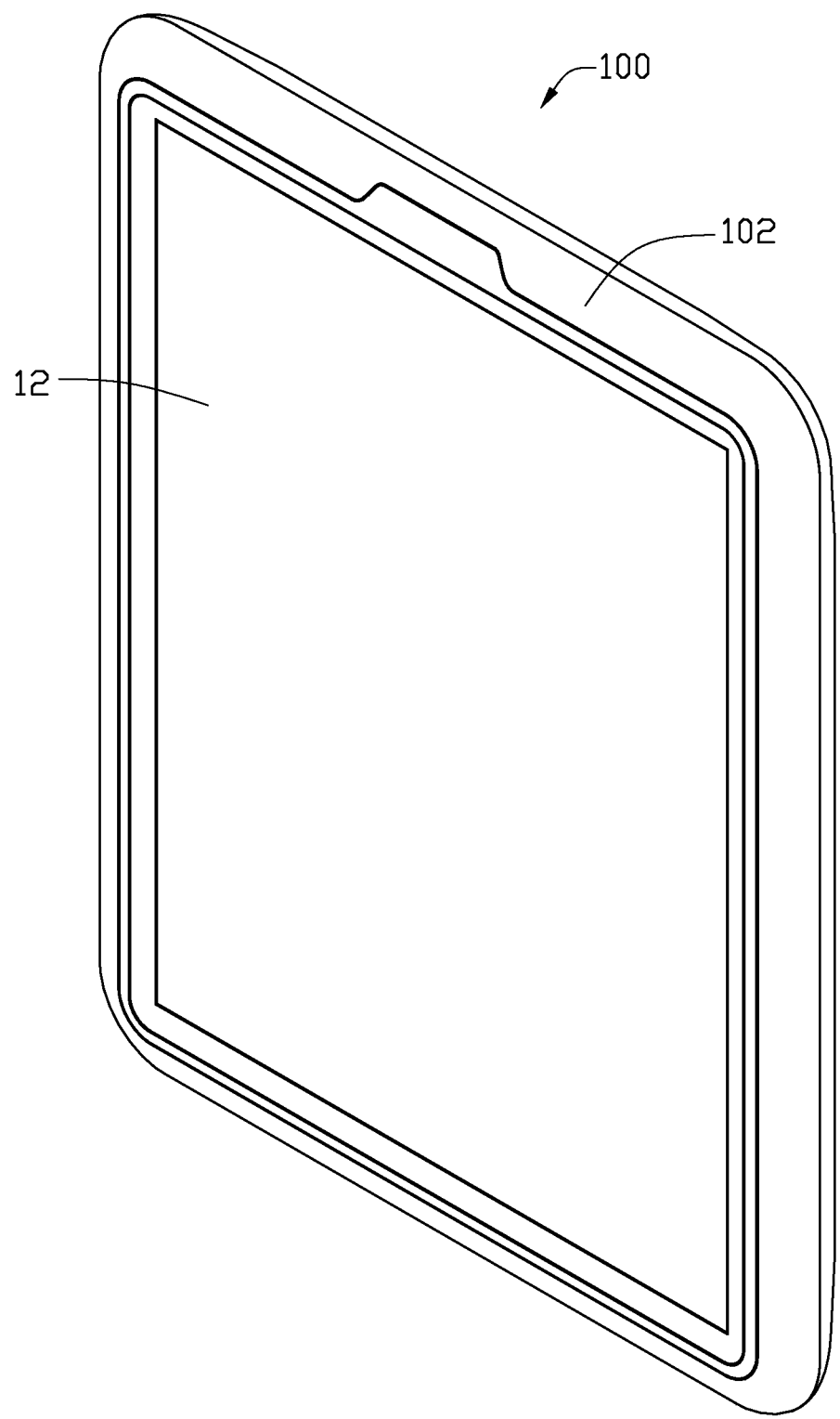
FIG. 3 is another isometric view of the portable electronic device of FIG. 1.
Figure 4:
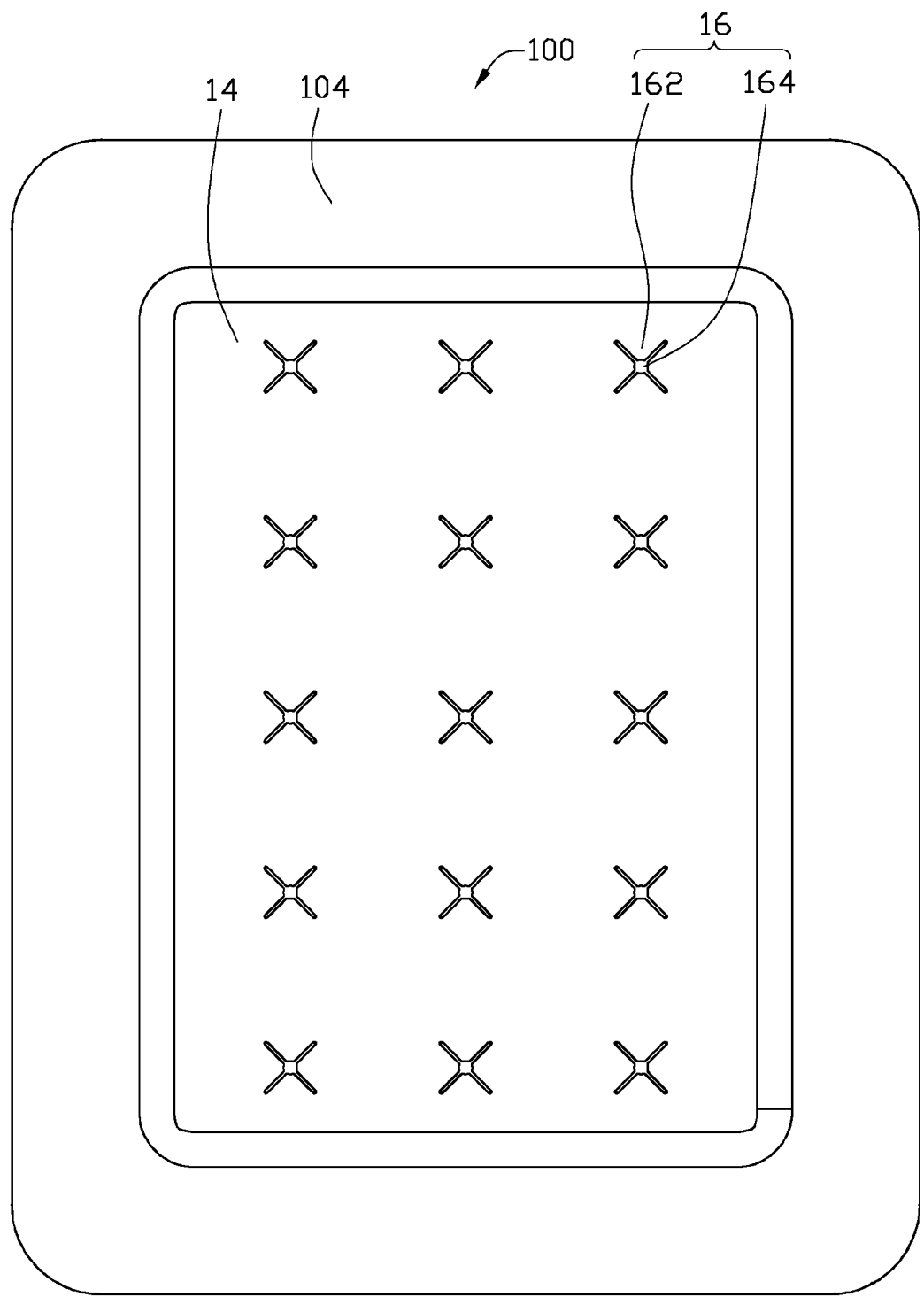
FIG. 4 is a rear plan view of the portable electronic device of FIG. 1.

Referring to FIGS. 3 and 4, the portable electronic device 100 includes a front 102 and a back 104. The front 102 includes a screen 12. In one embodiment, the screen 12 is a touch screen, which can be operated by touching control and browsed by a user. The back 104 includes an engagement zone 14, which is substantially rectangular in shape. The engagement zone 14 occupies a large area of the back 104. The engagement zone 14 can be made of an elastic material, such as an elastic rubber material. The supporting structure 1 includes a plurality of supporting portions 16 arranged on the engagement zone 14. The plurality of supporting portions 16 are arranged in a rectangle array and spaced from each other. Each supporting portion 16 is substantially an X-shaped hole, which includes four isosceles right triangle engagement pieces 162 spaced from each other and a connecting hole 164 enclosed by vertexes of the four engagement pieces 162. Each engagement piece 162 can tilt inwardly and outwardly along its two legs and related to its base-side when suffering an external force, thereby the engagement piece 162 may elastically deform and generate elastically restoring force, therefore enlarging an area of the connecting hole 164 (see FIG. 7). When the external force is removed, each engagement piece 162 may restore under the elastic restoring force.

Figure 5:
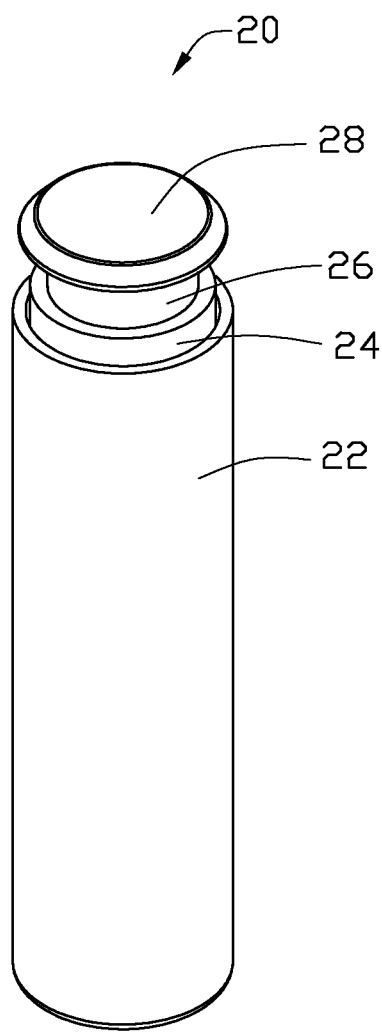
FIG. 5 is an isometric view of an exemplary embodiment of a holder of the supporting structure.
Figure 6:
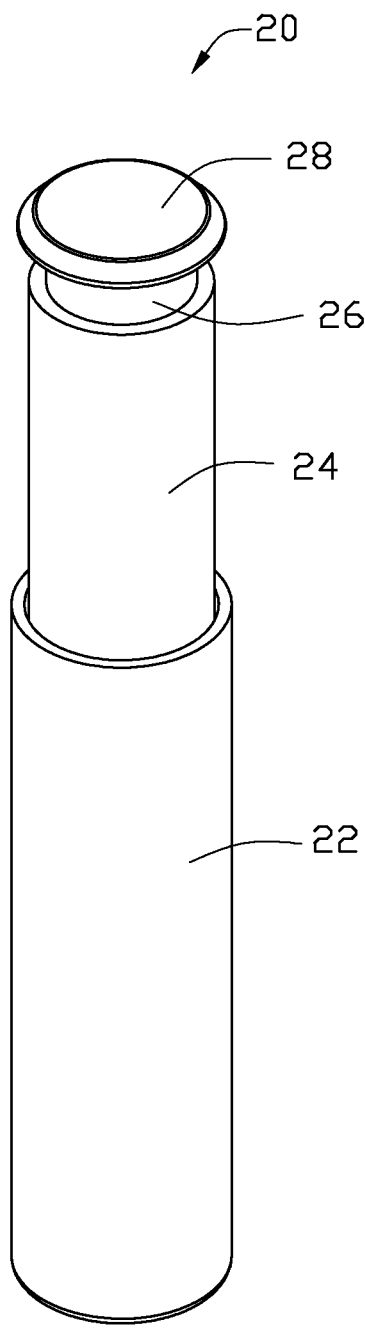
FIG. 6 is an isometric view of the holder in another state.

Referring to FIGS. 5 and 6, the supporting structure 1 further includes a holder 20 engaged with the supporting portion 16 for supporting the portable electronic device 100 at multiple angles. The holder 20 is substantially column shaped and includes a lower portion 22, an extending portion 24, a neck portion 26, and an upper portion 28. The lower portion 22 is a substantially hollow cylinder defining a receiving space therein. The extending portion 24 is received in the lower portion 22 and extends from an end of the lower portion 22. The extending portion 24 has a length substantially equal to a length of the lower portion 22. The extending portion 24 may be fully received in the lower portion 22 and fully extend out of the lower portion 22, thereby a length of the holder 20 is two times of the length of the lower portion 22 at this time. The neck portion 26 is coupled to an end of the extending portion 24 and extending from the lower portion 22. The neck portion 26 is substantially column shaped and has a smaller length than the extending portion 24. The upper portion 28 is coupled to an end of the neck portion 26 away from the extending portion 24. The upper portion 28 is a substantially thin disk in shape. A diameter of the neck portion 26 is smaller than the extending portion 24 and the upper portion 28.

Figure 7:
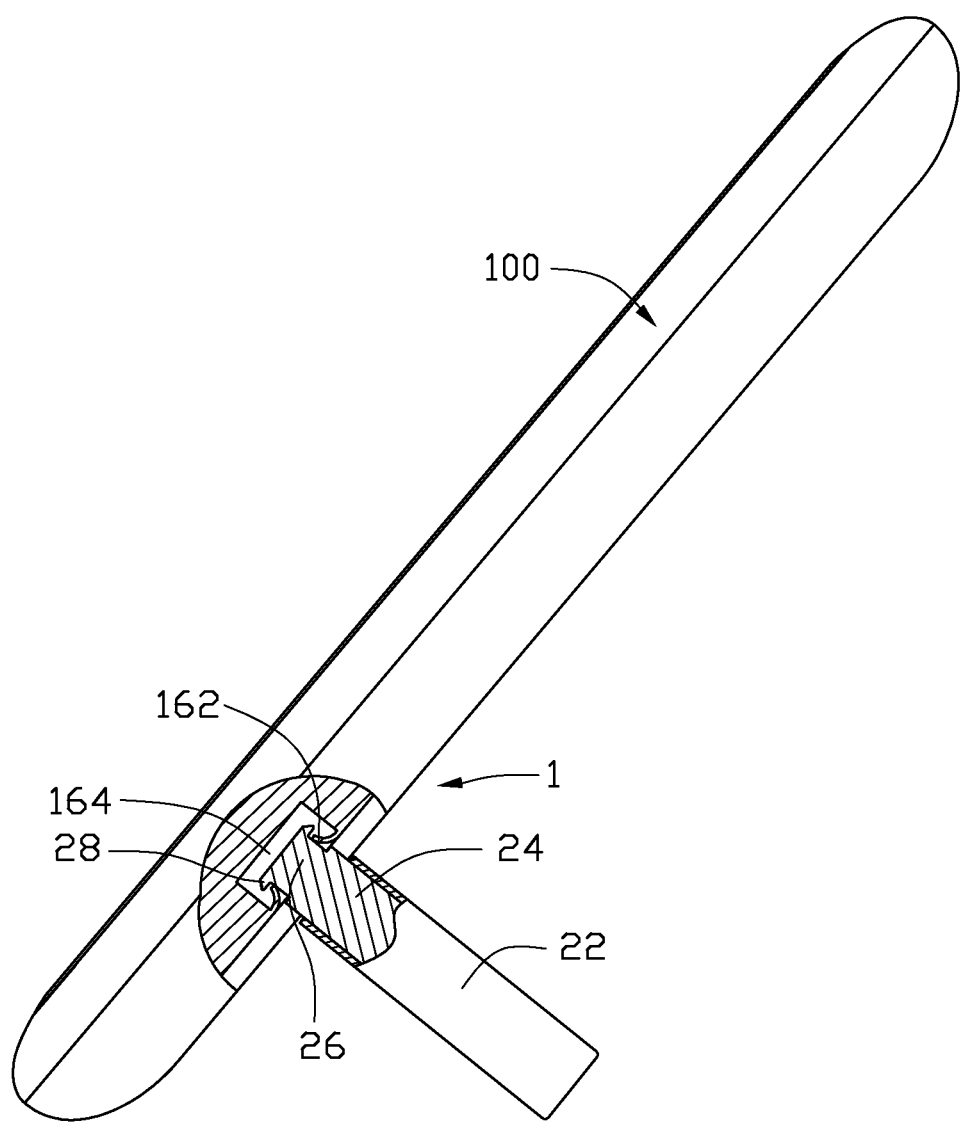
FIG. 7 is a partial cross-sectional view of FIG. 2.

Referring to FIGS. 2 and 7, the holder 20 is detachably coupled to the supporting portion 16. The upper portion 28 is aligned with one of the supporting portion 16 and pushes the engagement pieces 162 of the supporting portion 16, thereby each engagement piece 162 tilting inwardly along its two legs and related to its base-side. The holder 20 keeps moving towards the supporting portion 16 until the upper portion 28 passes the engagement pieces 162, the engagement pieces 162 restores to resist to the neck portion 26 according to the elastic restoring force. At this time, the upper portion 28 is received in the supporting portion 16 via the connecting hole 164. Therefore, the engagement pieces 162 can resist to the neck portion 26 and a surface of the upper portion 28 facing the neck portion 26, thereby the holder 16 can be firmly coupled to the supporting portion 16. When the portable electronic device 100 and the holder 20 are both placed on a horizontal plane, a desktop for example, the holder 20 can support the portable electronic device 100 at a predetermined angle.

Figure 8:
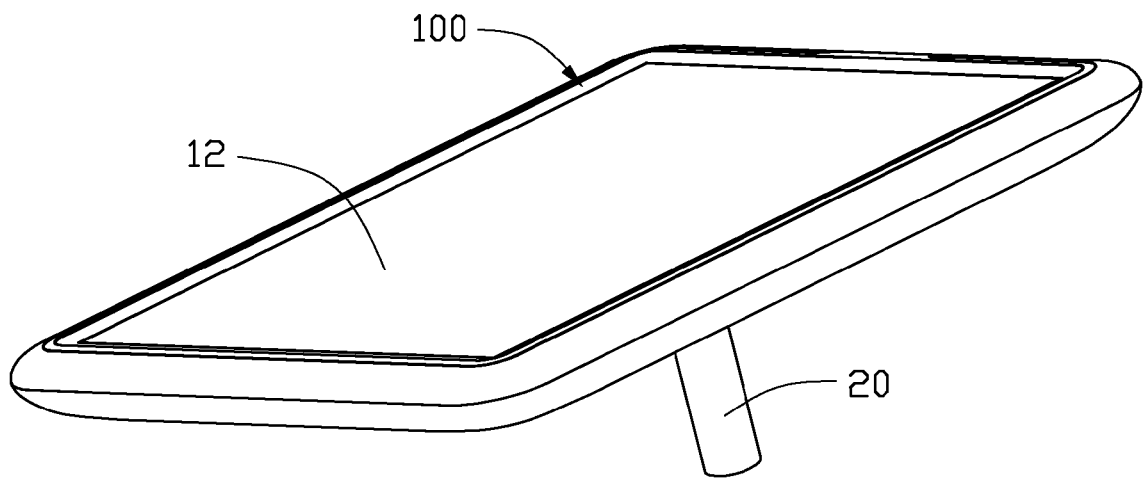
FIG. 8 is an isometric view of the holder assembled with the portable electronic device showing the holder in a first state.
Figure 9:
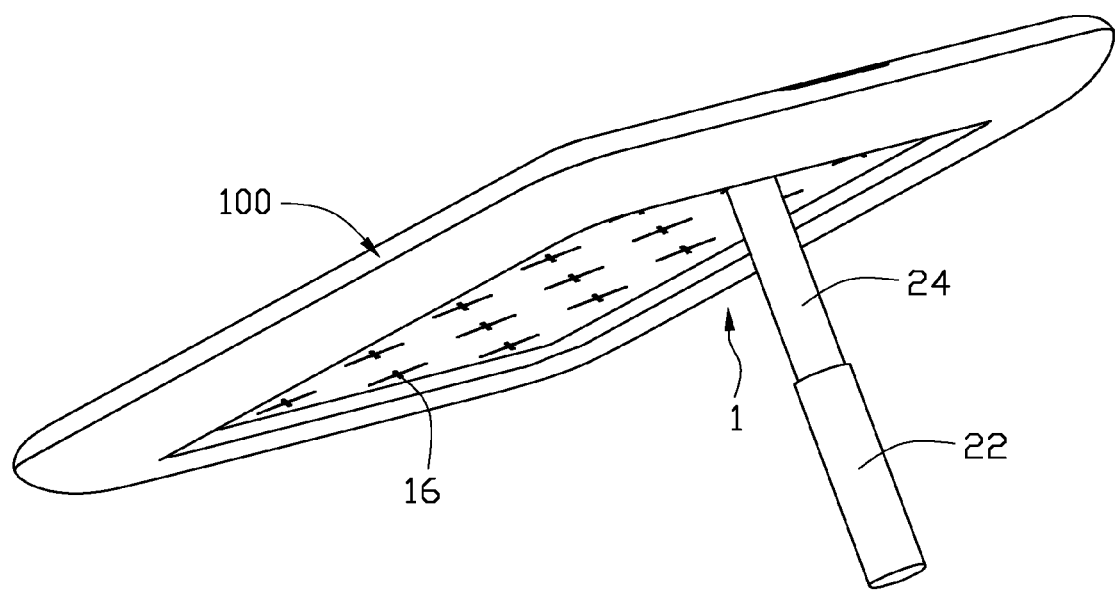
FIG. 9 is an isometric view of the holder assembled with the portable electronic device showing the holder in a second state.

Referring to FIGS. 8 and 9, after the holder 20 is firmly coupled to the supporting portion 16, a length of the extending portion 24 extended from the lower portion 22 can be adjusted, thereby adjusting an angle of the portable electronic device 100 related to the horizontal level and providing multiple angles for browsing by the user.

Also referring to FIGS. 2 and 8, the holder 20 can be coupled to different supporting portions 16, thereby adjusting an angle of the portable electronic device 100 related to the horizontal level and providing multiple angles for browsing by the user.

In one embodiment, the engagement zone 14 is spaced from other electronic elements of the portable electronic device 100, after the thin upper portion 28 is received in the supporting portions 16, the upper portion 28 may not reach any other electronic elements.

In one embodiment, the engagement zone 14 may also be defined in a back of a shielding case (not shown). When the shielding case holds a portable electronic device 100 therein, the engagement zone 14 of the shielding case may connect a holder 20, thereby the holder 20 can support the shielding case together with the portable electronic device 100.

In one embodiment, the portable electronic device 100 can connect to more than one holder 20 at a time, the holders 20 can be coupled to several corresponding supporting portions 16 in a same height row, thereby strengthening the supporting structure.

In one embodiment, the portable electronic device 100 and the holder 20 can also be placed on an area has a height difference, such as a ladder, the portable electronic device 100 is placed on a lower step, while the holder 20 is placed on a higher step, thus, the holder 20 can also support the portable electronic device 100 to stand.

The portable electronic device 100 defines a plurality of supporting portions 16 arranged in an array in the back 104. Each supporting portion 16 can engage at least one holder 20 to support the portable electronic device 100 at a predetermined angle related to the horizontal plane. By adjusting a length of the holder 20 or switching the holder 20 to different supporting portions 16 to adjust the angle of the portable electronic device 100. Therefore, this operation is convenient and meets different needs of users.

It is believed that the embodiments and their advantages will be understood from the foregoing description, and it will be apparent that various changes may be made thereto without departing from the scope of the disclosure or sacrificing all of its advantages, the examples hereinbefore described merely being illustrative embodiments of the disclosure.

What is claimed is:

1. A supporting structure for supporting a portable electronic device, the supporting structure comprising:
    a holder configured to be extendedly adjusted along a length of the holder; and
    a plurality of supporting portions defined in a back of the portable electronic device;
    wherein the holder is configured to detachably engage with one of the supporting portions to support the portable electronic device at a predetermined supporting angle related to a placing spot of the portable electronic device;
    wherein the supporting portions are arranged in a rectangular array, each supporting portion is substantially an X-shaped hole and includes four isosceles right triangle engagement pieces spaced from each other and a connecting hole enclosed by vertexes of the four engagement pieces.

2. The supporting structure as claimed in claim 1, wherein the holder is further configured to engage with other supporting portions or adjust the length to change the supporting angle.

3. The supporting structure as claimed in claim 2, wherein the portable electronic device includes an engagement zone on the back, the engagement zone is made of an elastic material, and the supporting portions are defined in the engagement zone.

4. The supporting structure as claimed in claim 3, wherein each engagement piece tilts inwardly and outwardly along its two legs and related to its base-side when suffering an external force, thereby the engagement piece elastically deforms and generates elastic restoring force, therefore enlarging a acreage of the connecting hole.

5. The supporting structure as claimed in claim 4, wherein each engagement piece restores under the elastic restoring force when the external force is removed.

6. The supporting structure as claimed in claim 4, wherein the holder is substantially column shaped and includes a lower portion, an extending portion, a neck portion, and an upper portion, the lower portion is a substantially hollow cylinder defining a receiving space; the extending portion is extendedly received in the lower portion and extends from the lower portion; the neck portion is coupled to an end of the extending portion and extending from the lower portion; the upper portion is coupled to the neck portion and extending from the lower portion.

7. The supporting structure as claimed in claim 6, wherein the extending portion has a length substantially equated to a length of the lower portion, the extending portion is fully received in the lower portion or fully extends out of the lower portion, thereby a length of the holder is two times of the length of the lower portion.

8. The supporting structure as claimed in claim 7, wherein the neck portion has a smaller length than the extending portion and a smaller diameter than the extending portion and the upper portion.

9. The supporting structure as claimed in claim 8, wherein when the holder is coupled to the supporting portion, the upper portion is aligned with one of the supporting portion and pushes the engagement pieces of the supporting portion, each engagement piece tilts inwardly until the upper portion passes the engagement pieces, the engagement pieces resist the neck portion to secure the holder to the portable electronic device.

10. The supporting structure as claimed in claim 9, wherein the supporting portions are spaced from other electronic elements of the portable electronic device to receive the upper portion in the supporting portion.

11. The supporting structure as claimed in claim 1, wherein the supporting portions are defined in a shielding case that holds the portable electronic device therein.

12. The supporting structure as claimed in claim 1, comprising more than one holders, wherein the holders are engaged with several corresponding supporting portions.

13. A portable electronic device comprising:
    an engagement zone arranged in a back and made of elastic material;
    a supporting structure comprising
    a holder configured to be extendedly adjusted along a length of the holder; and
    a plurality of supporting portions defined in engagement zone;
    wherein the holder is configured to detachably engage with one of the supporting portions to support the portable electronic device at a predetermined supporting angle related to a placing spot of the portable electronic device;
    wherein the holder is further configured to engage with other supporting portions or adjust the length to change the supporting angle; the supporting portions are arranged in a rectangular array, each supporting portion is substantially an X-shaped hole and includes four isosceles right triangle engagement pieces spaced from each other and a connecting hole enclosed by vertexes of the four engagement pieces.

14. The portable electronic device as claimed in claim 13, wherein each engagement piece tilts inwardly and outwardly along its two legs and related to its base-side when suffering an external force, thereby the engagement piece elastically deforms and generates elastic restoring force, therefore enlarging a acreage of the connecting hole.

15. The portable electronic device as claimed in claim 14, wherein the holder is substantially column shaped and includes a lower portion, an extending portion, a neck portion, and an upper portion, the lower portion is a substantially hollow cylinder defining a receiving space; the extending portion is extendedly received in the lower portion and extends from the lower portion; the neck portion is coupled to an end of the extending portion and extending from the lower portion; the upper portion is coupled to the neck portion and extending from the lower portion.

16. The portable electronic device as claimed in claim 15, wherein the extending portion has a length substantially equal to a length of the lower portion, the extending portion is fully received in the lower portion or fully extends out of the lower portion, thereby a length of the holder is two times of the length of the lower portion.

17. The portable electronic device as claimed in claim 16, wherein when the holder is coupled to the supporting portion, the upper portion is aligned with one of the supporting portion and pushes the engagement pieces of the supporting portion, each engagement piece tilts inwardly until the upper portion passes the engagement pieces, the engagement pieces resist the neck portion to secure the holder to the portable electronic device.

18. The portable electronic device as claimed in claim 13, comprising more than one holders, wherein the holders are engaged with several corresponding supporting portions.

* * * * *